United States Patent
Potter

(10) Patent No.: US 6,638,627 B2
(45) Date of Patent: Oct. 28, 2003

(54) METHOD FOR ELECTROSTATIC FORCE BONDING AND A SYSTEM THEREOF

(75) Inventor: Michael D. Potter, Churchville, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 10/016,782

(22) Filed: Dec. 10, 2001

(65) Prior Publication Data

US 2002/0072201 A1 Jun. 13, 2002

Related U.S. Application Data

(60) Provisional application No. 60/255,311, filed on Dec. 13, 2000.

(51) Int. Cl.[7] .............................. G11B 7/00; B32B 9/04
(52) U.S. Cl. ...................... 428/446; 156/273.1; 156/60; 365/151; 310/324; 428/461; 369/126; 257/350; 438/455
(58) Field of Search ................... 257/350; 310/324; 428/461, 446, 448; 365/151; 438/455; 156/273.1, 60; 369/126

(56) References Cited

U.S. PATENT DOCUMENTS

| | | | | |
|---|---|---|---|---|
| 3,397,278 A | * | 8/1968 | Pomerantz | 257/650 |
| 4,047,214 A | * | 9/1977 | Francombe et al. | 257/254 |
| 4,504,550 A | * | 3/1985 | Pook | 428/461 |
| 4,626,729 A | * | 12/1986 | Lewiner et al. | 310/324 |
| 4,996,627 A | * | 2/1991 | Zias et al. | 361/283.4 |
| 5,132,934 A | * | 7/1992 | Quate et al. | 369/126 |
| 5,228,373 A | * | 7/1993 | Welsch | 83/24 |
| 5,231,045 A | * | 7/1993 | Miura et al. | 438/459 |
| 5,739,834 A | * | 4/1998 | Okabe et al. | 347/111 |
| 5,777,977 A | * | 7/1998 | Fujiwara et al. | 369/126 |
| 6,037,797 A | * | 3/2000 | Lagowski et al. | 324/766 |
| 6,181,009 B1 | * | 1/2001 | Takahashi et al. | 257/735 |
| 6,265,758 B1 | * | 7/2001 | Takahashi | 257/637 |

* cited by examiner

Primary Examiner—Gregory Mills
Assistant Examiner—Ram N Kackar
(74) Attorney, Agent, or Firm—Nixon Peabody LLP

(57) ABSTRACT

A method for electrostatic bonding includes placing a first region of a first unit at least adjacent to a first region of a second unit. The first region of the first unit has trapped charge. A bond between the first region of the first unit and the first region of the second unit is formed by the electrostatic forces between the trapped charge and induced charge in the first region of the second unit. A system for electrostatic bonding includes a first unit having a first region with trapped charge and a second unit with a first region with induced charge. Electrostatic forces between the trapped charge in the first region of the first unit and the induced charge in the first region of the second unit bond the first and second units together.

34 Claims, 20 Drawing Sheets

METHOD FOR ELECTROSTATIC FORCE BONDING AND A SYSTEM THEREOF

This application claims the benefit of U.S. Provisional Patent Application Ser. No. 60/255,311 filed Dec. 13, 2000.

FIELD OF THE INVENTION

This invention relates generally to methods for bonding and systems thereof and, more particularly, to a method for electrostatic force bonding of at least one component to an assembly and a resulting system thereof.

BACKGROUND OF THE INVENTION

The assembly of many Micro-Electro-Mechanical System (MEMS) structures requires the accurate placement of components or sub-components on a substrate. This is especially true for optical MEMS devices. Typically, the sub-components are placed at the desired location on the substrate and then are permanently bonded by using some form of adhesive or by actuation of MEMS locking structures.

Unfortunately, it is very difficult to maintain proper component or sub-component registration while undergoing the permanent bonding process. Sub-components or components may move out of alignment as the epoxies cure or as solder reflows due to forces that exceed the temporary holding mechanisms or techniques.

SUMMARY OF THE INVENTION

A method for electrostatic bonding in accordance with one embodiment of the present invention includes placing a first region of a first unit at least adjacent to a first region of a second unit. The first region of the first unit has trapped charge. A bond between the first region of the first unit and the first region of the second unit is formed by the electrostatic forces between the trapped charge and induced charge in the first region of the second unit.

A system for electrostatic bonding in accordance with another embodiment of the present invention includes a first unit having a first region with trapped charge and a second unit with a first region with induced charge. Electrostatic forces between the trapped charge in the first region of the first unit and the induced charge in the first region of the second unit bond the first and second units together.

A method for making first and second units for electrostatic bonding in accordance with another embodiment of the present invention includes depositing a first insulating layer on at least a portion of a first substrate of a first unit. A second insulating layer is deposited on at least a portion of the first insulating layer to form a dual dielectric. Trapped charge is established at an interface between the first and second insulating layers. A first substrate for the second unit is provided. The second insulating layer is bonded to the second substrate with electrostatic forces between the trapped charge and induced charge in the first substrate of the second unit.

A system for electrostatic bonding in accordance with another embodiment of the present invention includes a first substrate, a first insulating layer on at least a portion of the substrate, a second insulating layer on at least a portion of the first insulating layer, and a second substrate. An interface between the first and second insulating layers has trapped charge. The second substrate has induced charge and is bonded to the second insulating layer with electrostatic forces between the trapped charge and the induced charge.

A method for making first and second units for electrostatic bonding in accordance with another embodiment of the present invention includes depositing a first conductive layer on at least a portion of a first substrate for the first unit. A first insulating layer is deposited on at least a portion of the first conductive layer. A second insulating layer is deposited on at least a portion of the first insulating layer to form a dual dielectric. A second conductive layer is deposited on at least a portion of the second insulating layer. An electrical bias is applied between the first conductive layer and the second conductive layer to inject at least a portion of the trapped charge into the second insulating layer. At least a portion of the injected trapped charge becomes trapped at an interface between the first and second insulating layers. The second conductive layer is removed after the applying of the electrical bias. A first substrate for the second unit is provided. The third insulating layer is bonded to the second substrate with electrostatic forces between the trapped charge and induced charge in the first substrate of the second unit.

A system for electrostatic bonding in accordance with another embodiment of the present invention includes a first substrate, a first conductive layer on at least a portion of the substrate, a first insulating layer on at least a portion of the first conductive layer, a second insulating layer and a second substrate. The second insulating layer is on at least a portion of the first insulating layer to form a dual dielectric and has trapped charge residing at an interface between the first and second insulating layers. The second substrate is bonded to the third insulating layer with electrostatic forces between the trapped charge and induced charge in the second substrate.

A method for making first and second units for electrostatic bonding in accordance with another embodiment of the present invention includes depositing a first insulating layer on at least a portion of a first substrate for the first unit. A first conductive layer is deposited on at least a portion of the first insulating layer. A second insulating layer is deposited on at least a portion of the first conductive layer. Trapped charge is established in the first conductive layer. A first substrate for the second unit is provided. The second insulating layer is bonded to the first substrate for the second unit with electrostatic forces between the trapped charge and induced charge in the first substrate of the second unit.

A system for electrostatic bonding in accordance with another embodiment of the present invention includes a first substrate, a first insulating layer on at least a portion of the substrate, a first conductive layer on at least a portion of the first insulating layer, and a second insulating layer on at least a portion of the first conductive layer that has trapped charge. A second substrate is provided and is bonded to the second insulating layer with electrostatic forces between the trapped charge and induced charge in the second substrate.

A method for making first and second units for electrostatic bonding in accordance with another embodiment of the present invention includes depositing a first conductive layer on at least a portion of a first substrate for the first unit. A first insulating layer is deposited on at least a portion of the first conductive layer. A second conductive layer is deposited on at least a portion of the first insulating layer. A second insulating layer is deposited on at least a portion of the second conductive layer. Trapped charge is established in the second conductive layer. A first substrate for the second unit is provided. The second insulating layer is bonded to the first substrate for the second unit with electrostatic forces between the trapped charge and induced charge in the first substrate of the second unit.

A system for electrostatic bonding in accordance with another embodiment of the present invention includes a first substrate, a first conductive layer, a first insulating layer, a second conductive layer, a second insulating layer, and a second substrate. The first conductive layer is on at least a portion of the first substrate. The first insulating layer is on at least a portion of the first conductive layer. The second conductive layer is on at least a portion of the first insulating layer and has trapped charge. The second insulating layer is on at least a portion of the second conductive layer. The second substrate has induced charge and is bonded to the second insulating layer with electrostatic forces between the trapped charge and induced charge in the second substrate.

The present invention provides an easy and effective method and system for temporarily or permanently bonding or holding two units together, such as a component or sub-component on an assembly, by taking advantage of the extremely strong electrostatic attraction between fixed charge and reflected induced charge. The two units could also have opposite sign charge to create an even stronger attractive or bonding force.

DETAILED DESCRIPTION OF THE INVENTION

Systems 10(1)–10(4) which uses electrostatic bonding in accordance with embodiments of the present invention are illustrated in FIGS. 1C, 2D, 3F, 4G, 5E, 6G, 7F, and 8(H). Each of these systems 10(1)–10 (4) includes an insulating layer 12, and an insulating layer 14 on a sub-component 16 for electrostatic force bonding to an assembly 18. The method includes establishing a trapped charge in a region of the sub-component 16 or other unit and bonding the region of sub-component 16 to a region of assembly 18 with electrostatic forces between the trapped charge and an induced charge in the region of the assembly 18 or other unit. The present invention provides an easy and effective method and system for temporarily or permanently bonding or holding the sub-component 16 on the assembly 18.

Figure 1A:
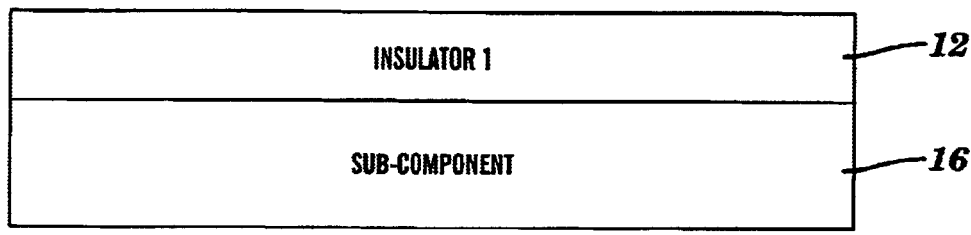
FIGS. 1A–1C are cross-sectional views of a method for making a component with a trapped charge for electrostatic bonding with induced charge on an assembly in accordance with one embodiment of the present invention.
Figure 1B:
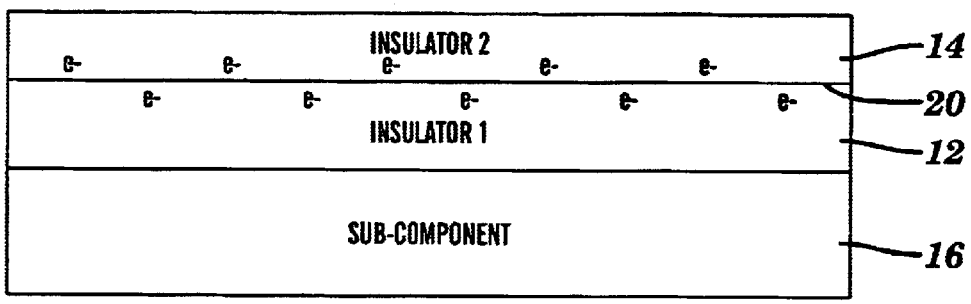
Figure 1C:
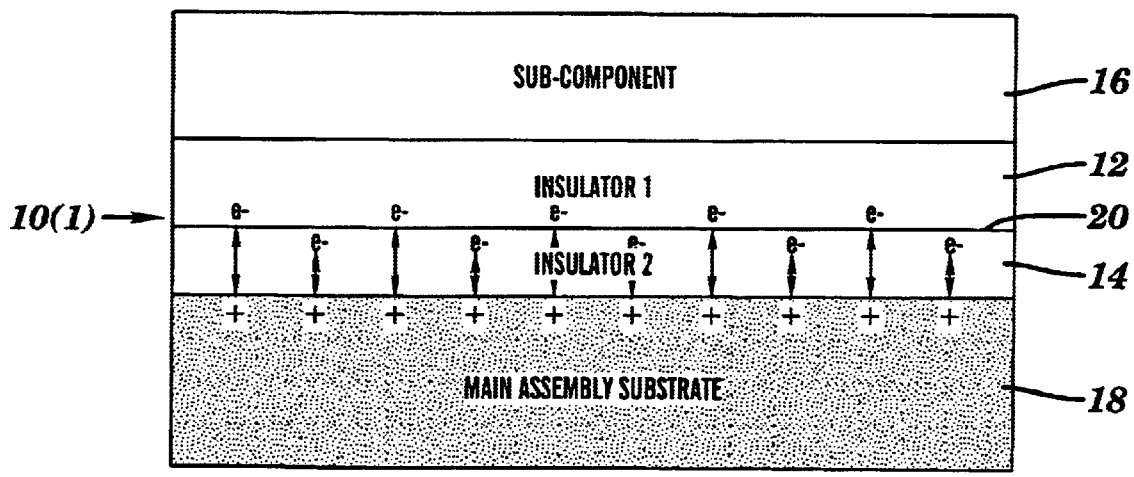
Figure 2A:
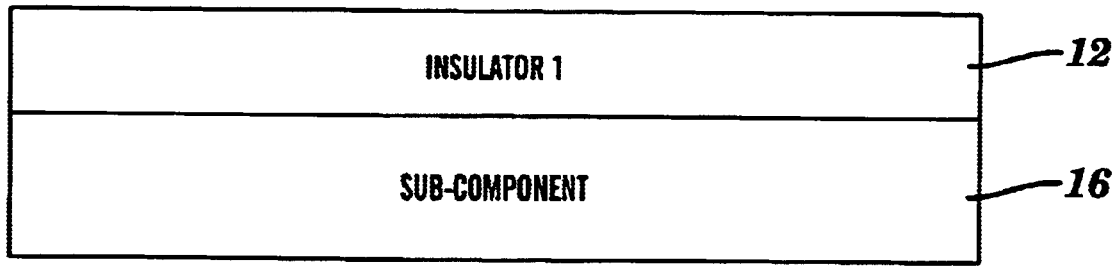
FIGS. 2A–2D are cross-sectional views of a method for making a component with a trapped charge for electrostatic bonding with induced charge on an assembly in accordance with a second embodiment of the present invention.
Figure 2B:
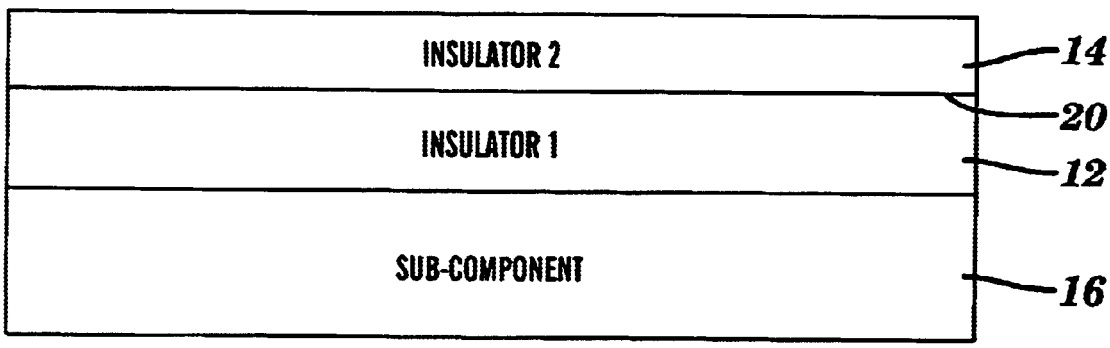
Figure 2C:
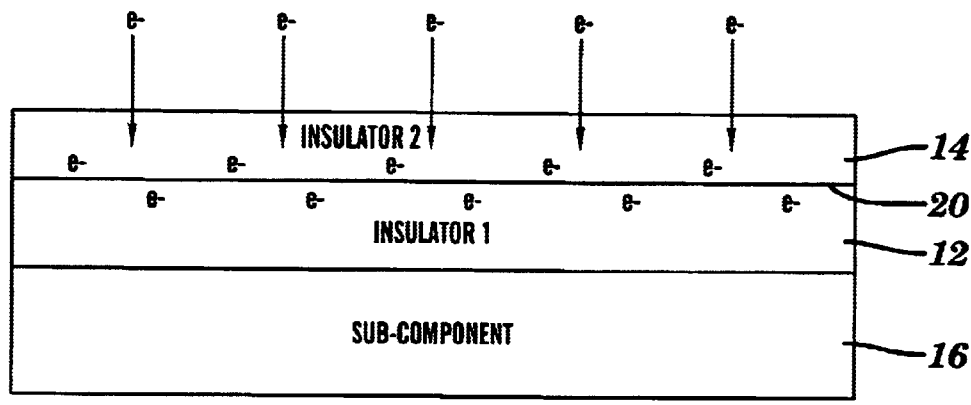
Figure 2D:
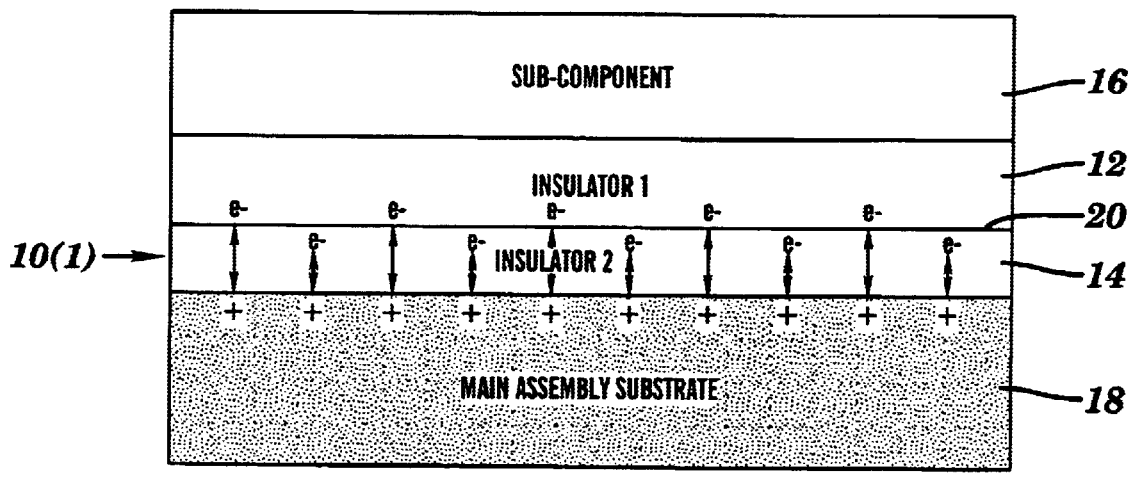
Figure 3A:
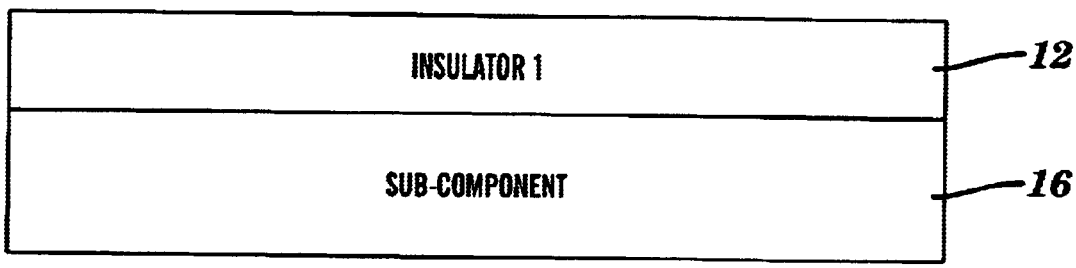
FIGS. 3A–3F are cross-sectional views of a method for making a component with a trapped charge for electrostatic bonding with induced charge on an assembly in accordance with a third embodiment of the present invention.
Figure 3B:
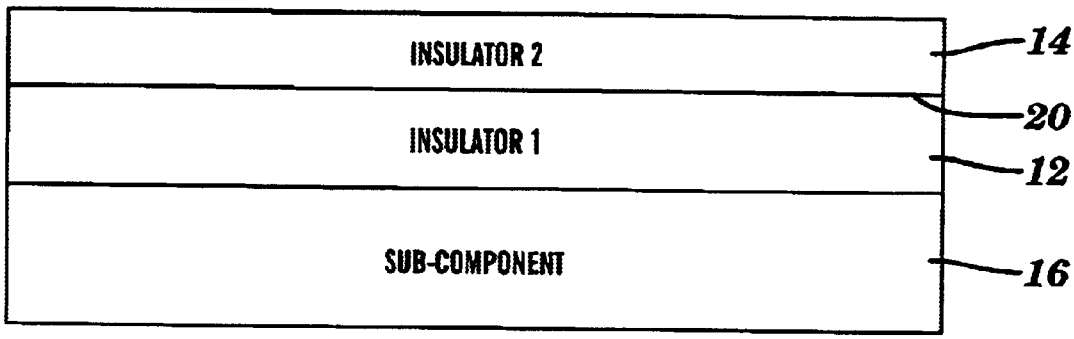
Figure 3C:
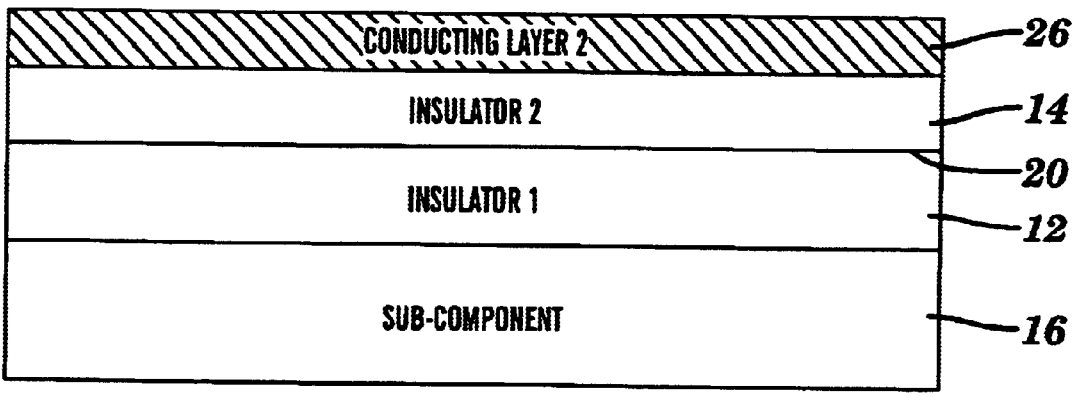
Figure 3D:
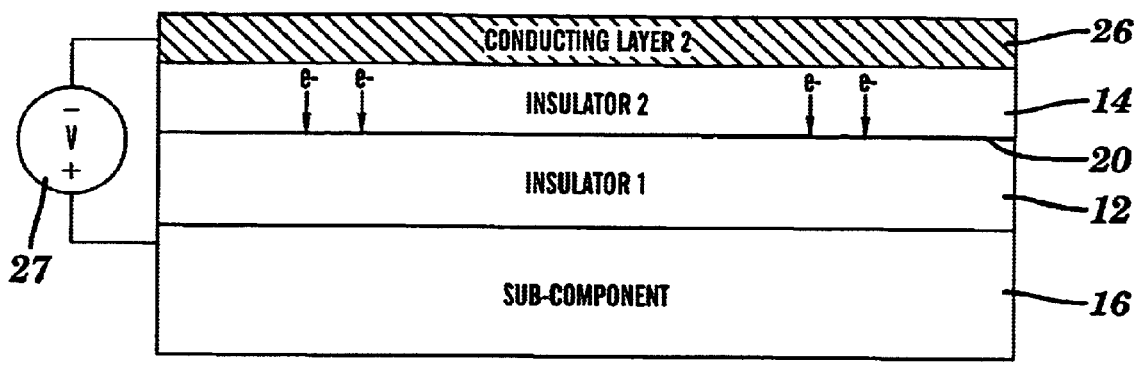
Figure 3E:
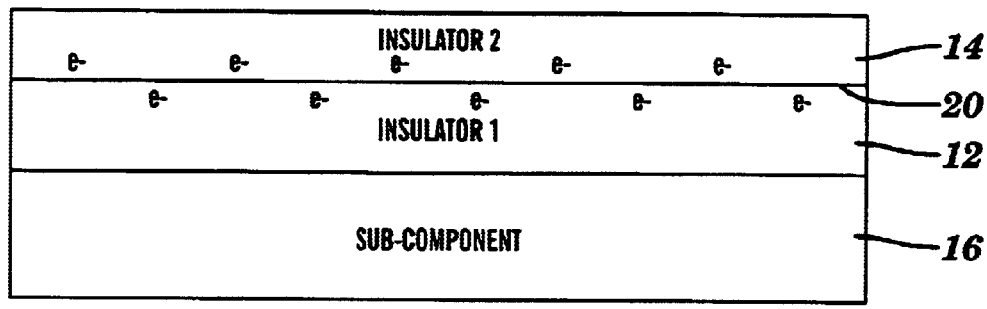
Figure 3F:
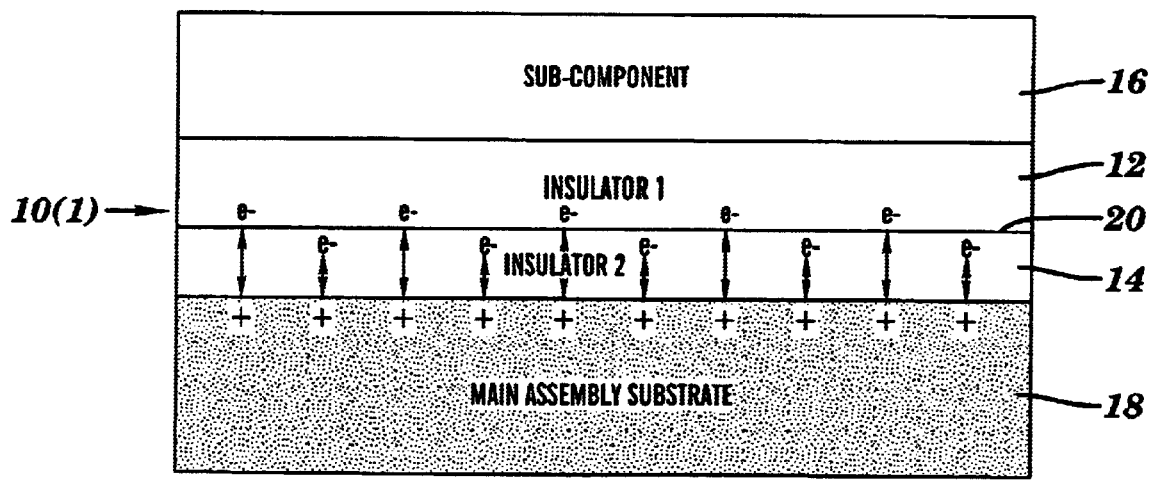

Referring FIGS. 1C, 2D, and 3F die system 10(1) for electrostatic bonding in accordance with one embodiment includes the sub-component 16, although other types of devices, such as any type of assembly, sub-assembly, component, or unit, could be used for sub component 16. The insulating layer 12 is located on one surface of the sub-component 16. In this particular embodiment, the insulating layer 12 is silicon oxide, although insulating layer 12 could comprise other types of materials, such as silicon nitride or aluminum oxide. Another insulating layer 14 is located on the insulating layer 12 to form a dual dielectric. In this particular embodiment, the insulating layer 14 is silicon nitride, although insulating layer 14 could comprise other types of materials, such as silicon oxide or aluminum oxide. Additionally, in this particular embodiment the insulating layer 14 is thinner then the insulating layer 12 to permit the bonding from the electrostatic forces between the trapped charge and the induced charge with assembly 18, although the cross-sectional widths of each these insulating layers 12 and 14 can vary as necessary. Trapped charge is located at and adjacent to an interface 20 between the insulating layers 12 and 14. Typically, the interface 20 between the insulating layers 12 and 14, has trapped charge with a charge trap density that may be as high as $1e14 q/cm^2$.

An important consideration is the retention time of the trapped charge, i.e. the mean time to fifty percent charge loss. Typically, the charge loss mechanism will be charge tunneling to the conduction band of the insulating layer 14. With an appropriate thickness of the insulating layer 14, a field sufficient to tunnel charge into the conduction band of the insulating layer 14 due to the trapped charge will not occur. By way of example only, an appropriate thickness of insulating layer 14 may be about 0.01 microns to 1.0 microns, although this thickness will vary based on the particular application. Non-thermally assisted charge loss will not lead to fifty percent loss of trapped charge for many years.

In this particular embodiment, the assembly 18 is a substrate which has induced charge adjacent at least one surface, although other types of assemblies can be used, such as a sub-assembly, component, or unit for assembly 18. The assembly 18 is bonded to the insulating layer 14 by electrostatic forces between the trapped charge in and around the interface 20 and the induced charge in assembly 18.

The electrostatic force is given by $F = q^2/(2A\epsilon_0\epsilon_i)$, where q=charge, A=area, $\epsilon_0$ and $\epsilon_i$ equal the permittivity of free space and the permittivity of the insulating layer 14 between the trapped charge and the complementary surface, respectively. By way of example only, for a charge density=$1e13/cm^2$ and a $\epsilon_I=3.85$ the electrostatic force is 3.76 microNewtons/$\mu^2$ Since $C=\epsilon_0\epsilon_i A/d$ where d is the distance between capacitor parallel plates and V=q/C or V=qd/$\epsilon_0\epsilon_i A$, therefore the effective voltage for a centroid of $1e13/cm^2$ charge located $0.1\mu$ from the image charge is approximately 47V.

An optional bonding material (not shown), such as an adhesive, may be located between the insulating layer 14 and the assembly 18 to help secure the sub-component 16 to the assembly 18. Although in the embodiments described herein, the sub-component 16 has the insulating layers 12 and 14 with the trapped charge and the assembly 18 has the induced charge, other configurations are possible, such as the assembly 18 having the insulating layers 12 and 14 with the trapped charge and the sub-component 16 having the induced charge.

Figure 4A:
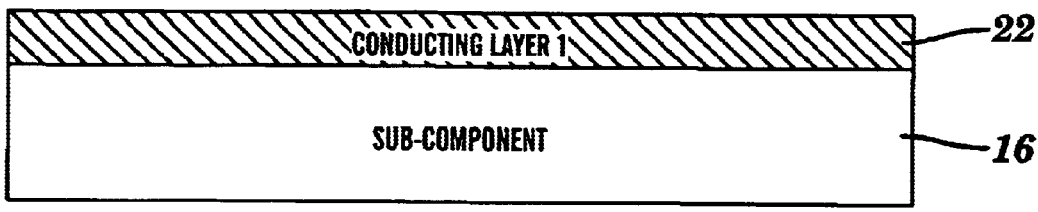
FIGS. 4A–4G are cross-sectional views of a method for making a component with a trapped charge for electrostatic bonding with induced charge on an assembly in accordance with a fourth embodiment of the present invention.
Figure 4B:
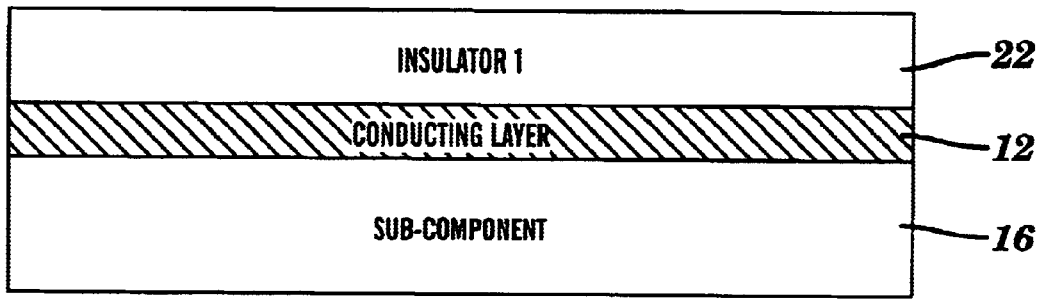
Figure 4C:
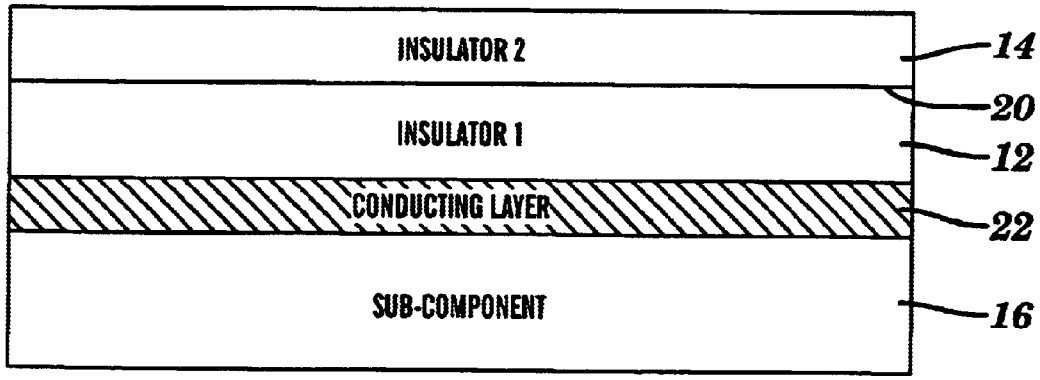
Figure 4D:
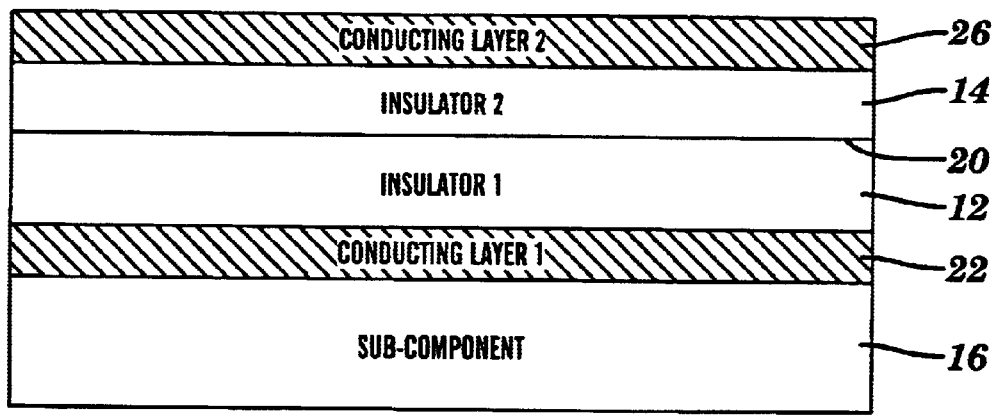
Figure 4E:
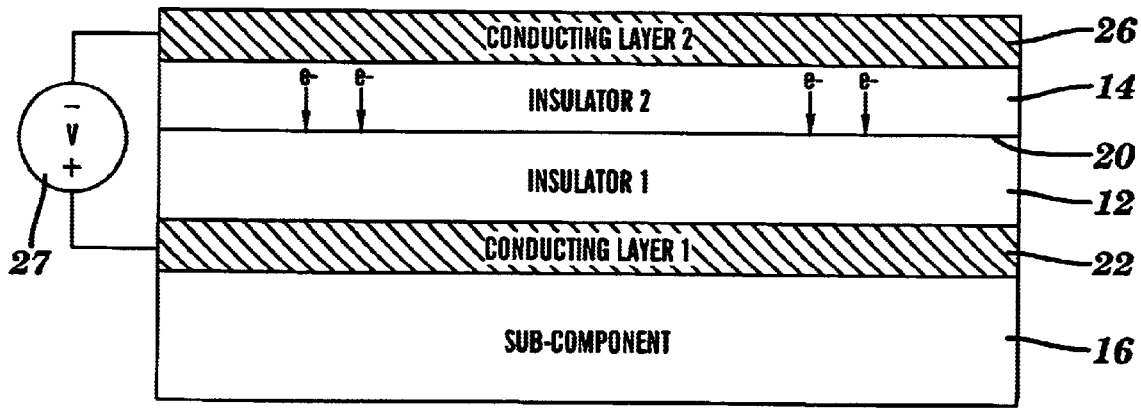
Figure 4F:
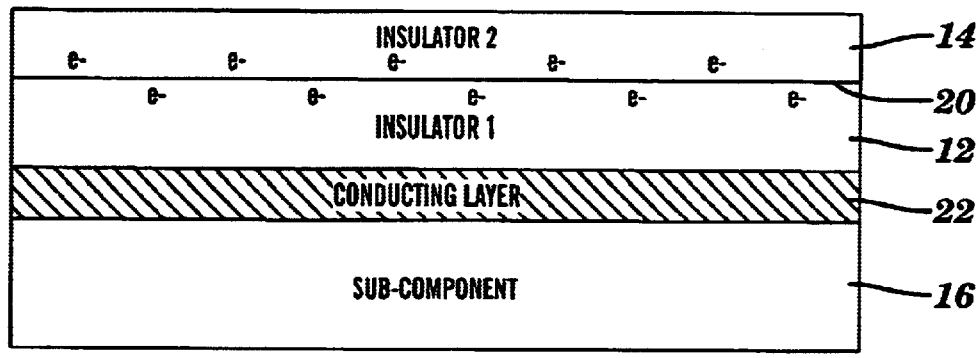
Figure 4G:
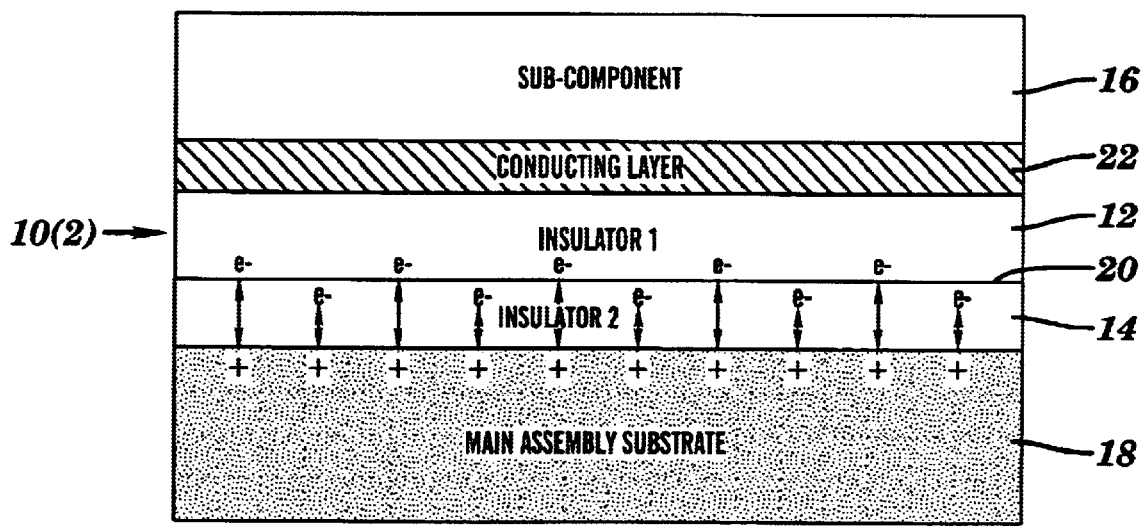

Referring to FIG. 4G, a system 10(2) for electrostatic bonding in accordance with another embodiment is identical to the system 10(1) shown in FIGS. 1C, 2D, and 3F, except as described herein. In this particular embodiment, system 10(2) includes a conductive layer 22 that is located between the insulating layer 12 and the sub-component 16.

Figure 5A:
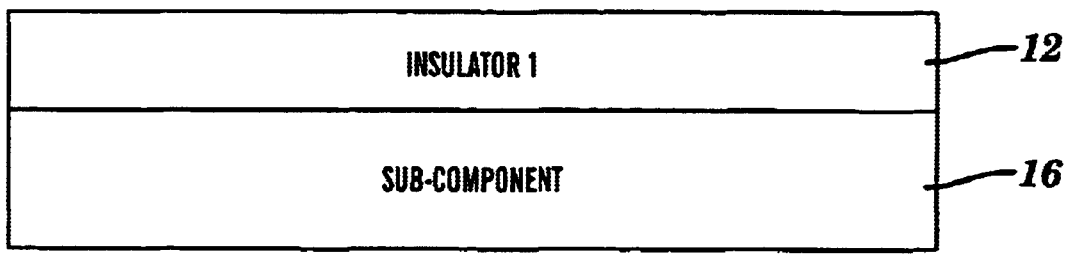
FIGS. 5A–5E are cross-sectional views of a method for making a component with a trapped charge for electrostatic bonding with induced charge on an assembly in accordance with a fifth embodiment of the present invention.
Figure 5B:
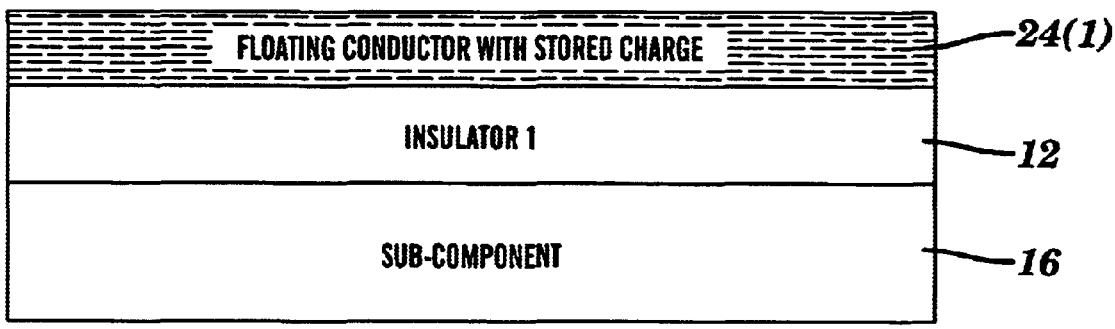
Figure 5C:
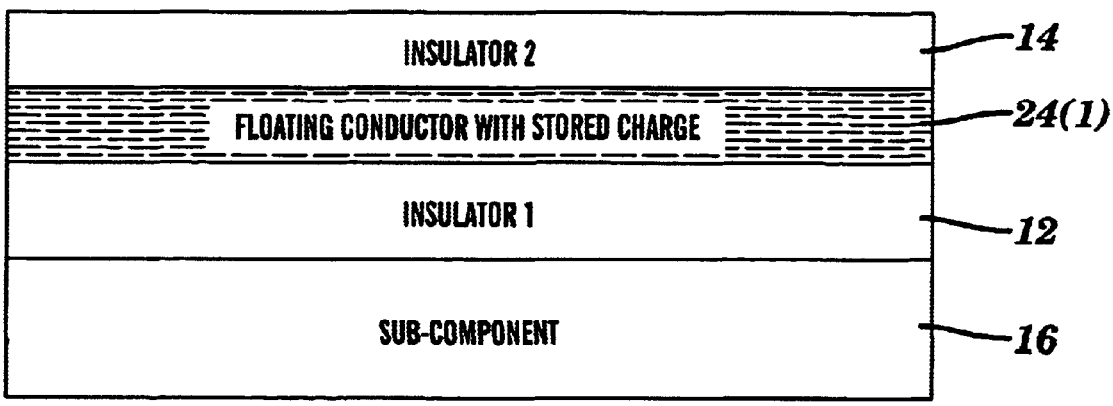
Figure 5D:
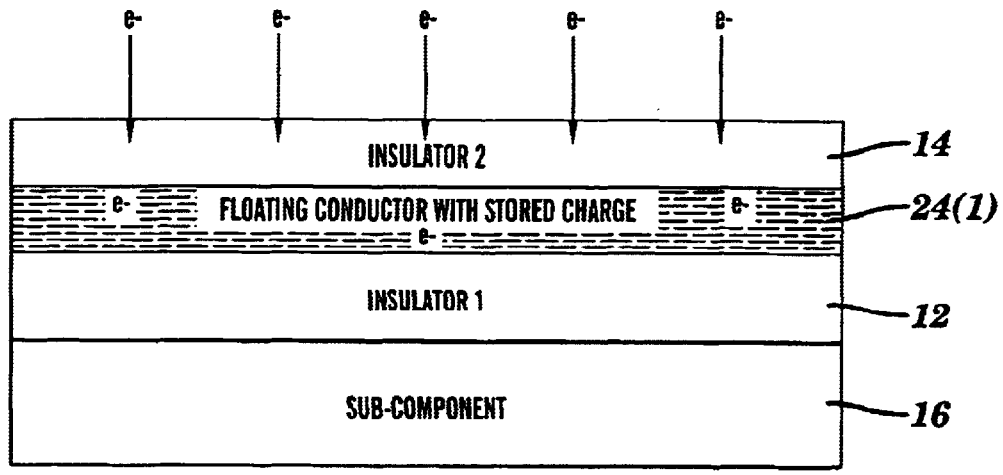
Figure 5E:
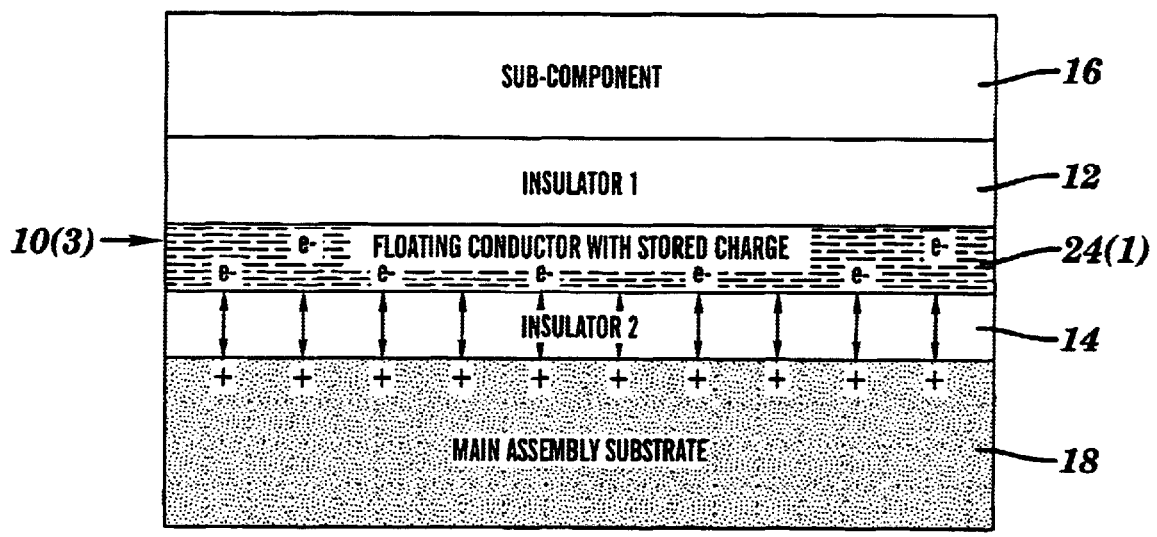
Figure 6A:
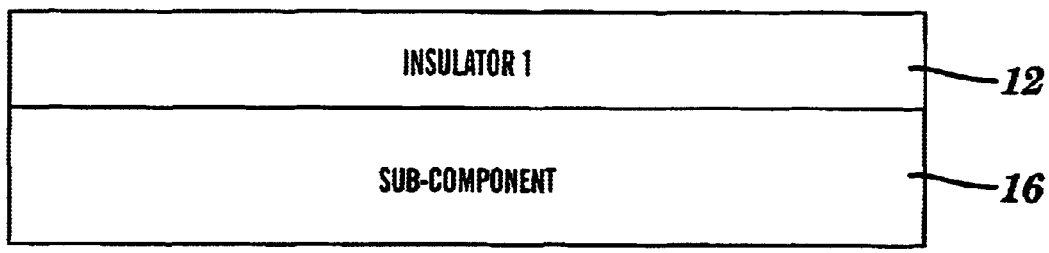
FIGS. 6A–6G are cross-sectional views of a method for making a component with a trapped charge for electrostatic bonding with induced charge on an assembly in accordance with a sixth embodiment of the present invention.
Figure 6B:
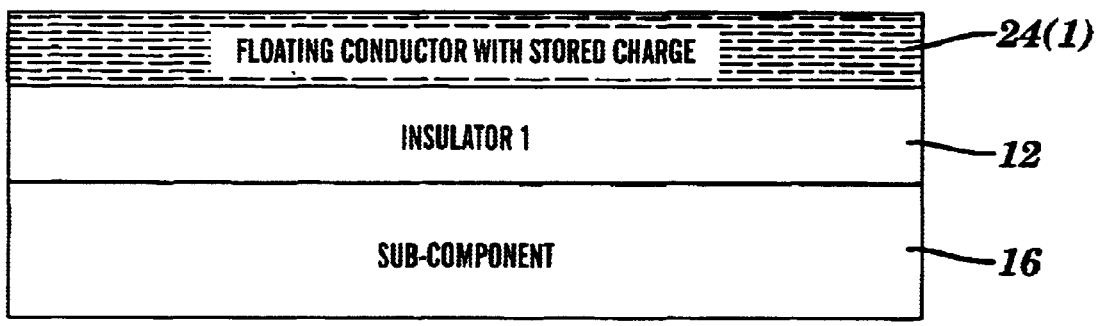
Figure 6C:
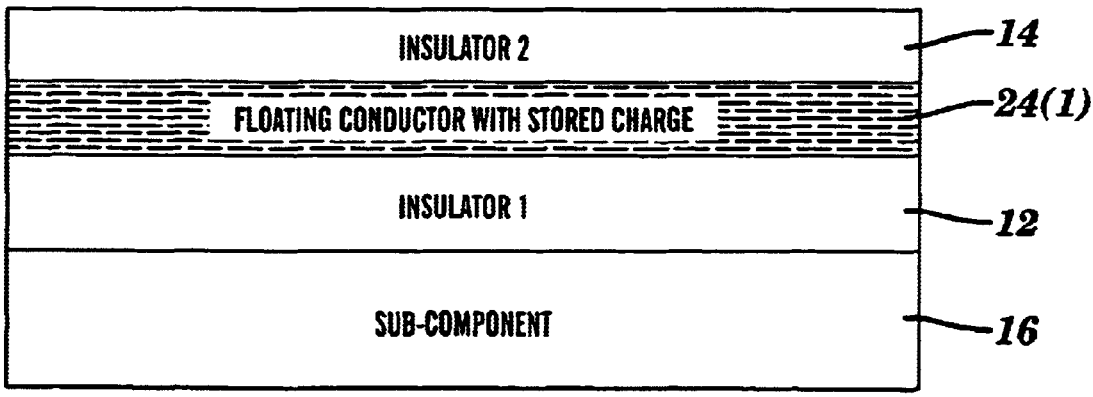
Figure 6D:
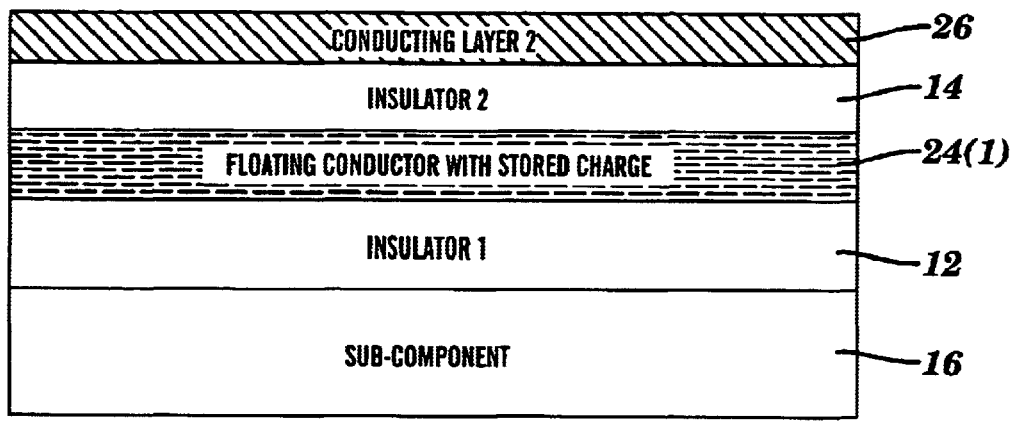
Figure 6E:
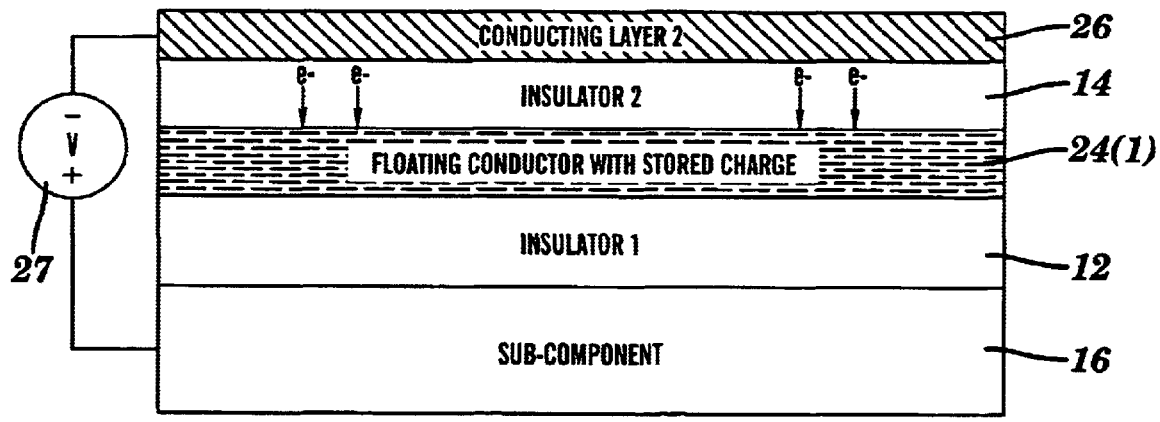
Figure 6F:
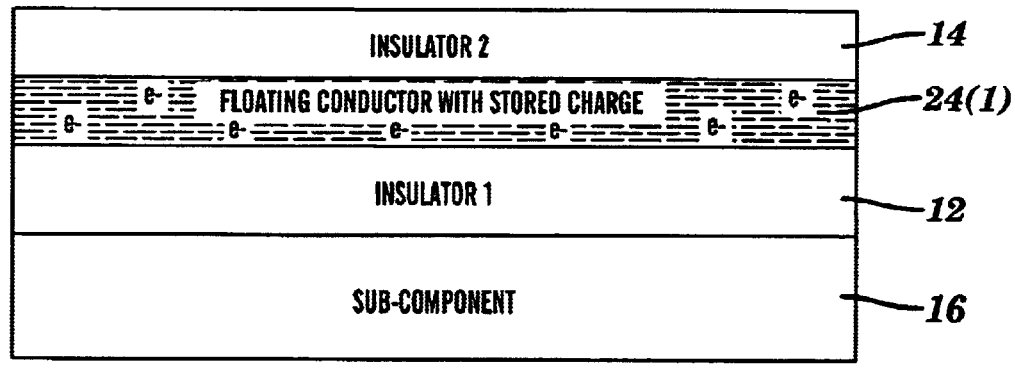
Figure 6G:
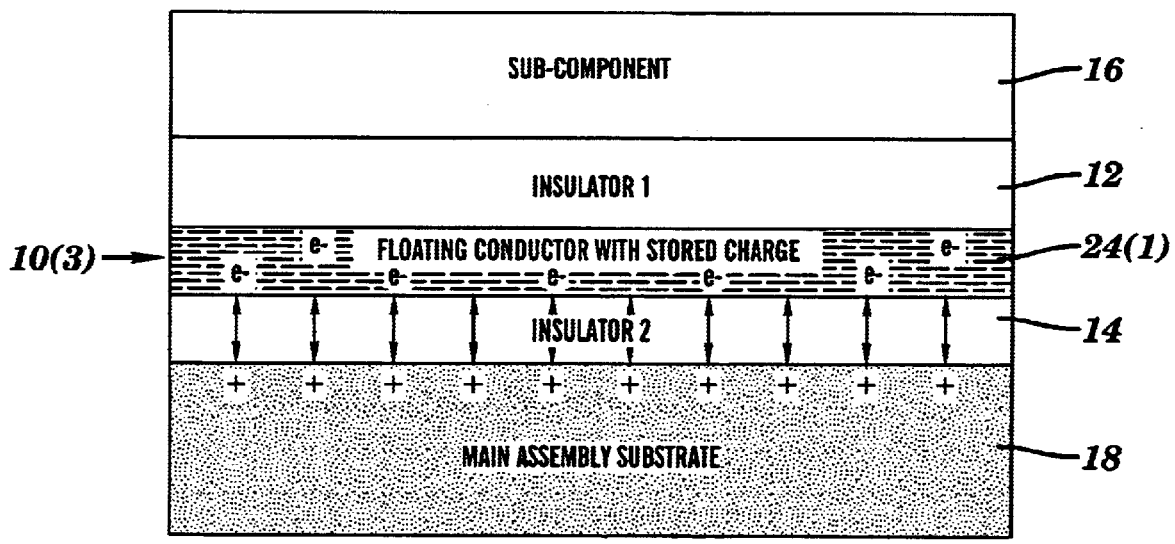

Referring to FIGS. 5E and 6G, the system 10(3) for electrostatic bonding in accordance with another embodiment is identical to the system 10(1) shown in FIGS. 1C, 2D, and 3F, except as described herein. In this particular embodiment, system 10(3) includes a floating conductive layer 24(1) that is located between the insulating layers 12 and 14, although other types of conductive layers could be used. A floating conductive layer 24(1) is as a charge storing layer. The trapped charge is stored in this conductive layer 24(1) and can be used for the electrostatic bonding with the induced charge.

Figure 7A:
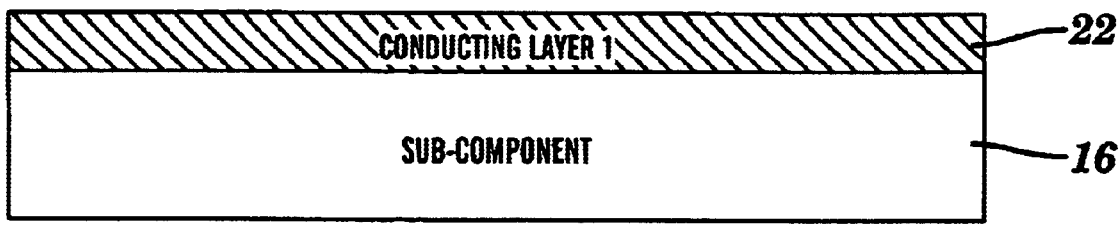
FIGS. 7A–7F are cross-sectional views of a method for making a component with a trapped charge for electrostatic bonding with induced charge on an assembly in accordance with an eighth embodiment of the present invention.
Figure 7B:
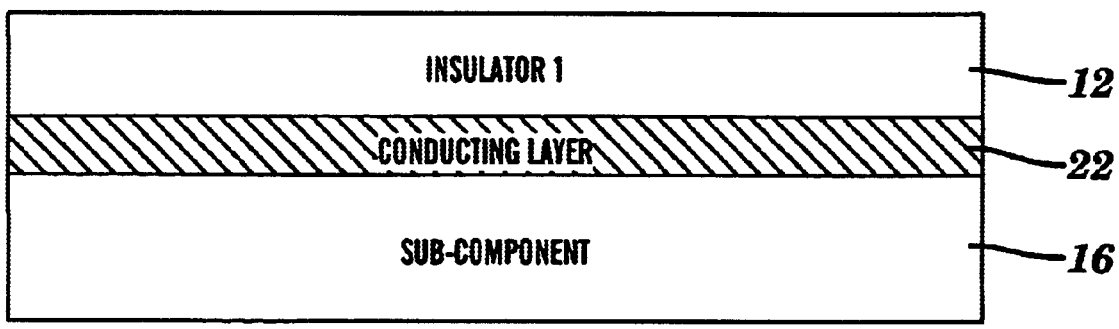
Figure 7C:
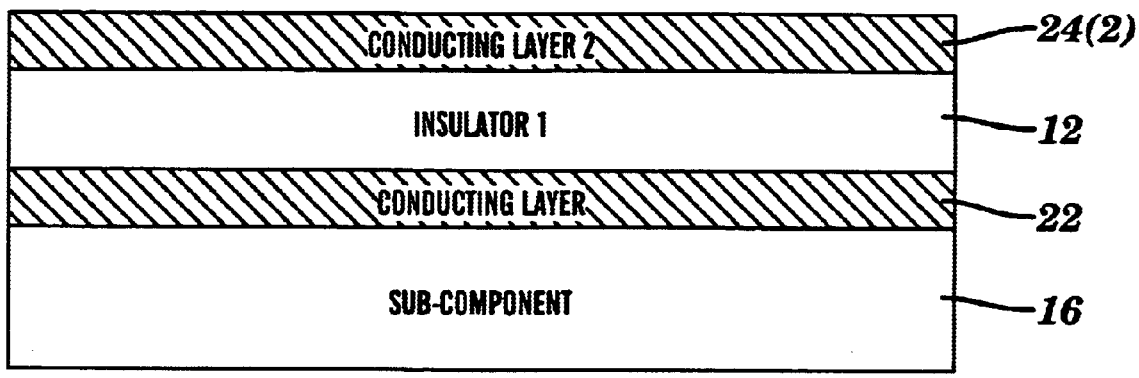
Figure 7D:
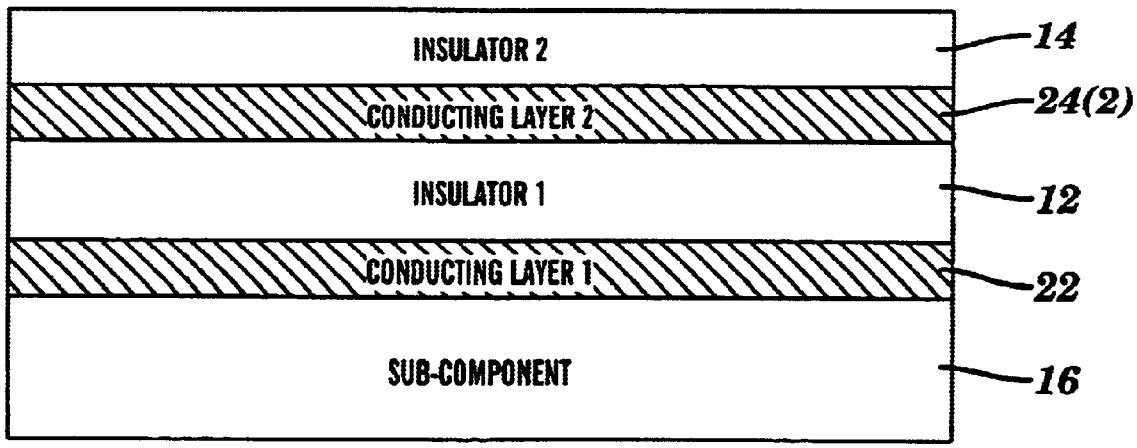
Figure 7E:
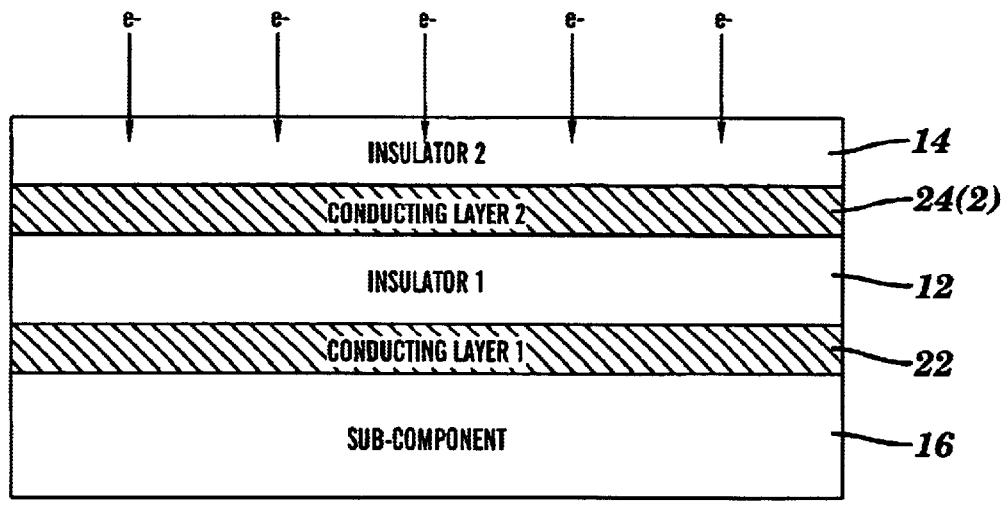
Figure 7F:
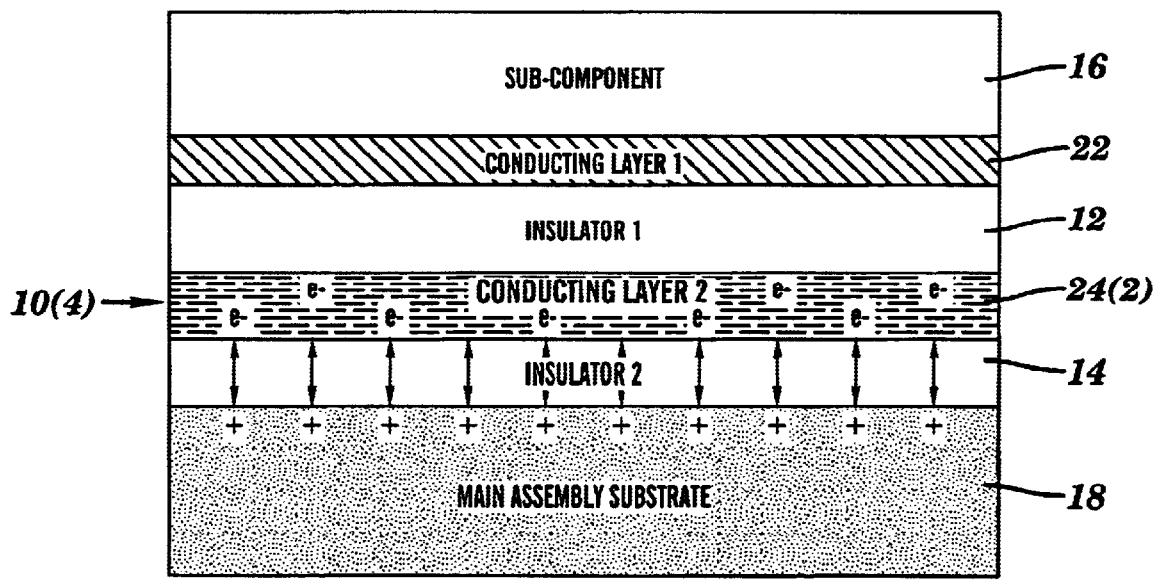
Figure 8A:
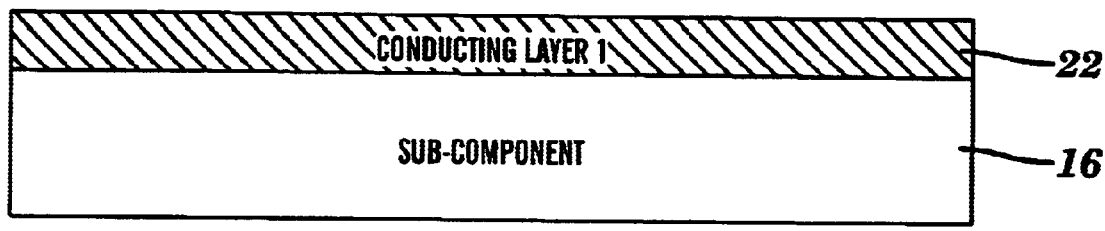
FIGS. 8A–8H are cross-sectional views of a method for making a component with a trapped charge for electrostatic bonding with induced charge on an assembly in accordance with a seventh embodiment of the present invention.
Figure 8B:
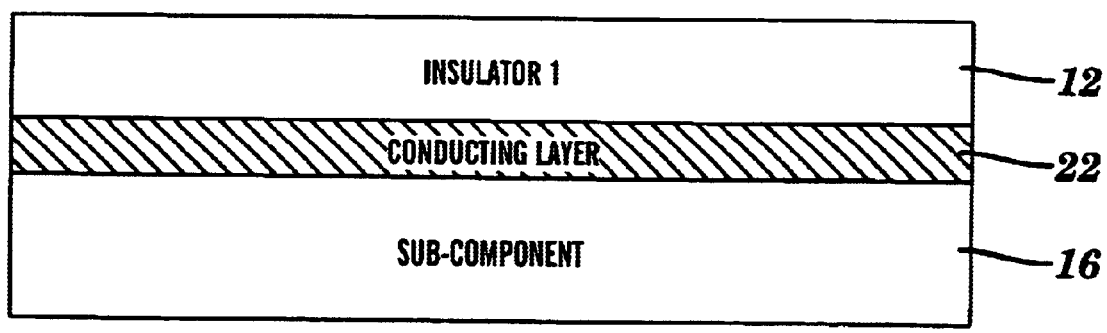
Figure 8C:
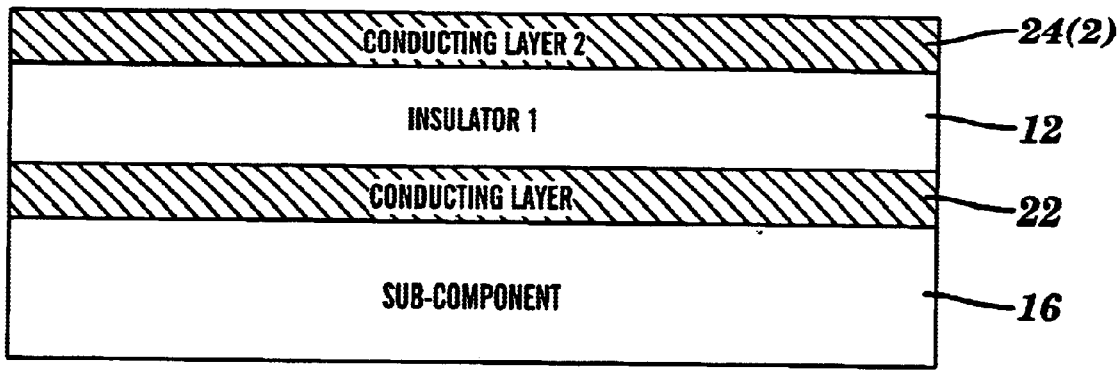
Figure 8D:
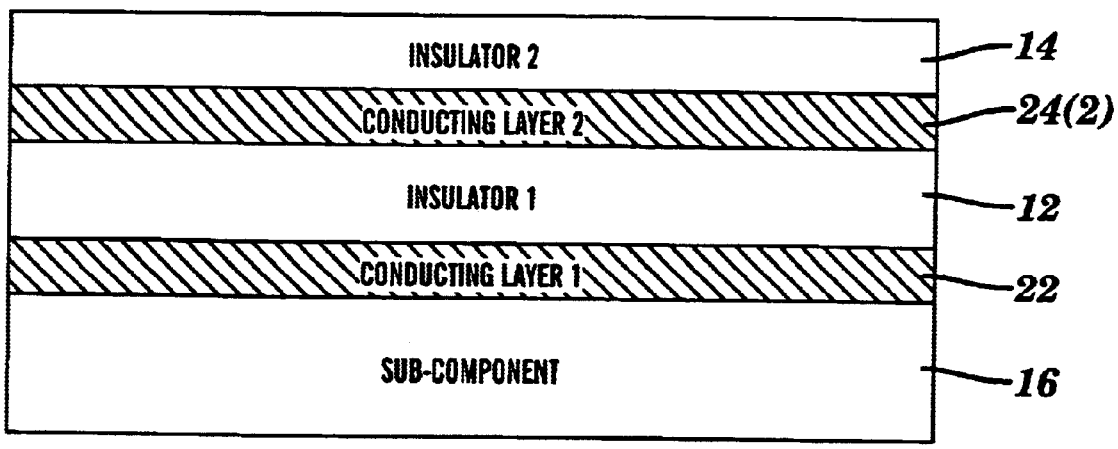
Figure 8E:
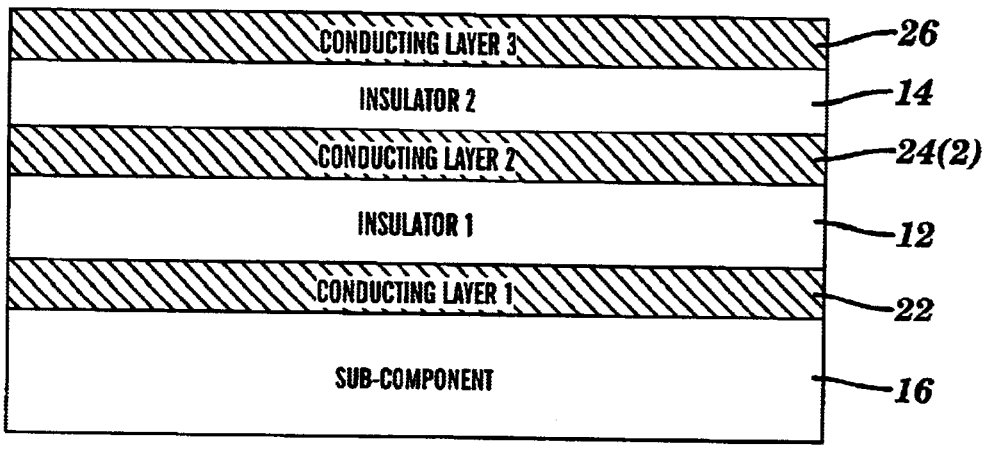
Figure 8F:
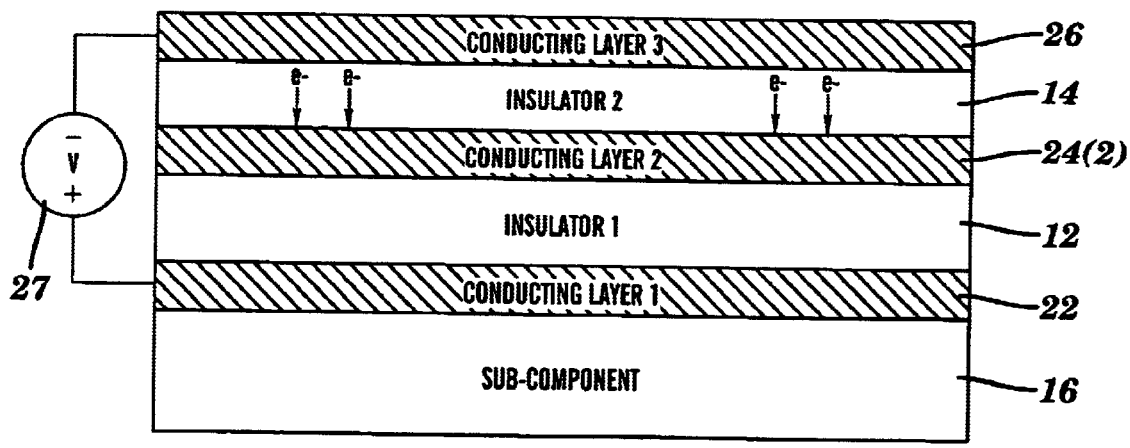
Figure 8G:
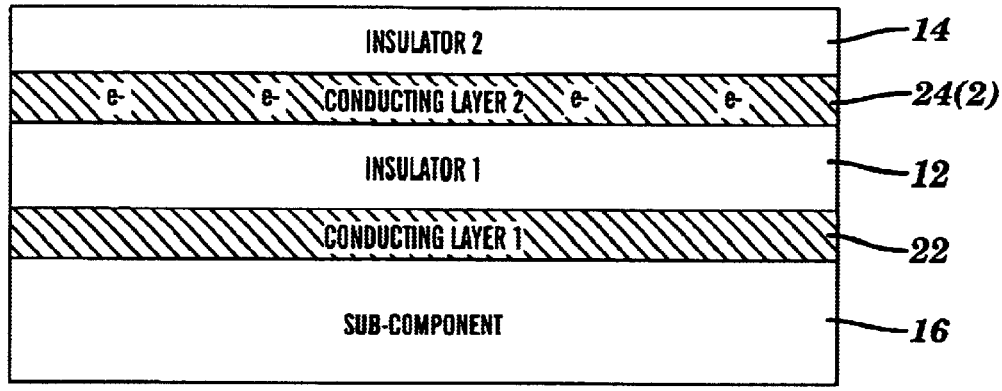
Figure 8H:
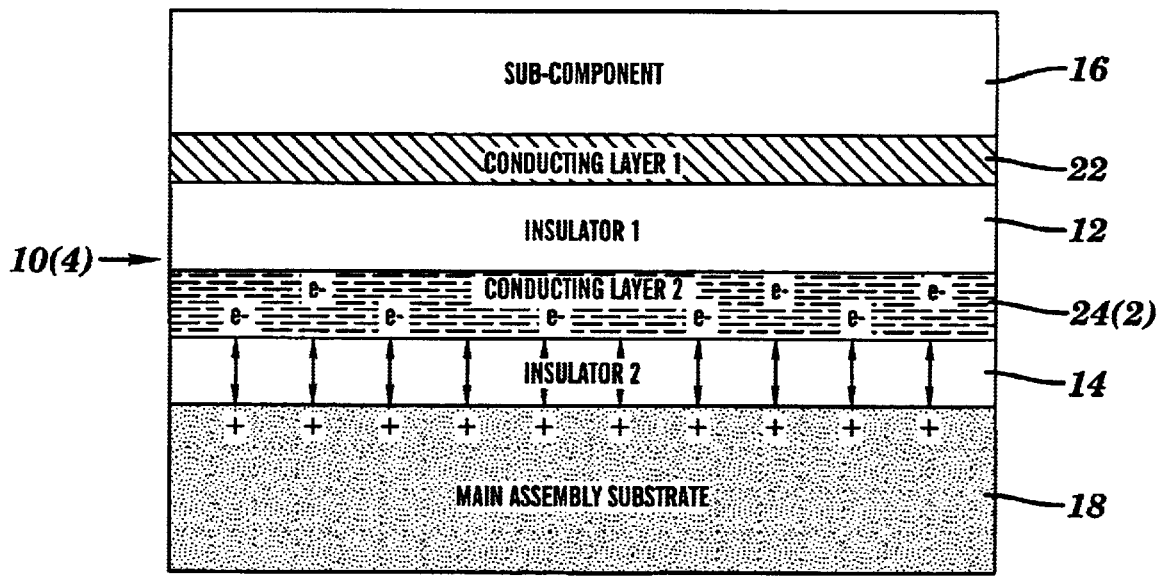

Referring to FIGS. 7F and 8H, the system 10(4) for electrostatic bonding in accordance with another embodiment is identical to the system 10(1) shown in FIGS. 1D, 2D, and 3F, except as described herein. In this particular embodiment, system 10(4) includes a conductive layer 22 located between the sub-component 16 and the insulating layer 12 and another conductive layer 24(2) is located between the insulating layers 12 and 14, although other types of conductive layers could be used. At least a portion of the trapped charge is stored in the conductive layer 24(2) and can be used for electrostatic bonding with the induced charge. System 10(4) also includes for the electrostatic bonding with the induced charge.

Referring to FIGS. 1A–1C, a method for making electrostatic force bonding in accordance with one embodiment of the present invention will be described. In this method, an insulating layer 12 is deposited on a sub-component 16 as shown in FIG. 1A. A variety of different techniques for depositing, forming, or otherwise connecting the insulating layer 12 on or to sub-component 16 can be used, such as a chemical vapor deposition process.

Next, another insulating layer 14 is deposited on the insulating layer 12 to form a dual dielectric as shown in FIG. 1B. An interface 20 is located between the insulating layers 12 and 14 where trapped charge "e–" resides, although other types of trapped charge can be used, such as "+" if the trapped charge is holes. Again a variety of different techniques for depositing, forming, or otherwise connecting the insulating layer 14 on or to insulating layer 12 can be used, such as a chemical vapor deposition process.

Techniques that can be used to store high densities of trapped charge at the interface 20 include, but are not limited to high field electron tunneling, energetic charge injection, ballistic particle injection, and the charging of floating imbedded conductive layers.

Next, an assembly 18 which has "+" induced charge is provided, although other types of induced charge can be used, such as "–" if the trapped charge is "+". The insulating layer 14 with the trapped charge at the interface 20 and connected to the insulating layer 12 and to the sub-component 16 is placed adjacent to or on the desired location on assembly 18. Electrostatic forces between the trapped charge and the induced charge bond the insulating layer 14 to the assembly 18 as shown in FIG. 1C. A bonding material may be applied on at least a portion of the insulating layer 14 and/or the assembly 18 to help to affix the sub-component 16 to the assembly 18.

Referring to FIGS. 2A–2D, a method for making electrostatic force bonding in accordance with another embodiment of the present invention will be described. The portion of the method described above and shown in FIGS. 1A and 1C for depositing the insulating layer 12 on sub-component 16 and placing the insulating layer 14 on or adjacent to the assembly 18 for electrostatic bonding is identical to the portion of the method shown in FIGS. 2A and 2D and thus will not be described again here.

Once insulating layer 12 is deposited on sub-component 16 as shown in FIG. 2A, another insulating layer 14 is deposited on the insulating layer 12 to form a dual dielectric as shown in FIG. 2B. Again a variety of different techniques for depositing, forming, or otherwise connecting the insulating layer 14 on or to insulating layer 14 can be used, such as a chemical vapor deposition process. In this particular embodiment, the deposition of the insulating layer 14 may not establish trapped charge at the interface 20 of insulating layers 12 and 14 or a higher density of trapped charge may be desired.

Next, charge is injected into the insulating layer 14 and becomes established at and around the interface 20 between insulating layers 12 and 14 as shown in FIG. 2C. A variety of techniques for injecting charge can be used, such as accelerating electrons through a potential and then injecting them. This injection process may be used when there is no trapped charge or to increase the amount of trapped charge at and around the interface 20 between insulating layers 12 and 14.

Referring to FIGS. 3A–3F, a method for making electrostatic force bonding in accordance with another embodiment of the present invention is described below. The portion of the method described above and shown in FIGS. 2A, 2B, and 2D for depositing insulating layer 12 on sub-component 16, depositing insulating layer 14 on insulating layer 12, and placing insulating layer 14 on or adjacent to assembly 18 for electrostatic bonding is identical to the portion of the method shown in FIGS. 3A, 3B, and 3F and thus will not be described again here.

Once the insulating layer 14 is deposited on insulating layer 12, a conductive layer 26 is deposited on the insulating layer 14 as shown in FIG. 3C. A variety of different techniques for depositing, forming, or otherwise connecting the conductive layer 26 on or to insulating layer 14 can be used including, but not limited to sputtering and chemical vapor deposition. In this particular embodiment, at least a portion of the sub-component 16 is made of a conductive material, although the sub-component 16 could be made of other types of materials.

Next, power source 27, such as a voltage source, is connected between and applies an electrical bias between the sub-component 16 and the conductive layer 26 as shown in FIG. 3D. When a sufficient electrical bias is applied between the sub-component 16 and the conductive layer 26, electrons can be forced to tunnel to the conduction band of insulating layer 14 to be trapped at the interface 20 creating the trapped charge. In this particular embodiment, an electrical bias of about $10^7$ volts/cm was applied to create an electric field sufficiently strong for the tunneling, although the amount of bias applied can vary as necessary. In order to control which electrode, i.e. the sub-component 16 or the conductive layer 26, either injects electrons or extracts electrons (hole injection), the polarity of the bias must be defined, and the thickness of each insulating layer 12 and 14 must be controlled, as well as the material choice for the insulating layer 12 and 14, (i.e. the permittivity and band gap considerations). In this particular embodiment, the sub-component 16 is connected to the positive terminal of power supply 27 and the conductive layer 26 is connected to the negative terminal of power supply 27, the insulating layer 12 is about 0.1 microns thick and is made of $Si_3N_4$, insulating layer 14 is about 0.03 microns thick and is made of $SiO_2$, although other parameters could be used. While it is usually easier to trap electrons at the interface 20 or on a floating conductive layer 24(1) embedded in a dielectric, such as insulating layers 12 and 14, it is also possible to extract electrons leaving a net positive charge. i.e. trapped holes. This injection process by applying an electrical bias may be used when there is no trapped charge or to increase the amount of trapped charge at and around the interface 20 between insulating layers 12 and 14.

Next, the power source 27 is turned off or disconnected and the conductive layer 26 is removed as shown in FIG. 3E. A variety of different techniques for removing the conductive layer 26 from insulating layer 14 can be used, such as an etching process. Trapped charge "e−" resides at the interface 20 between the insulating layers 12 and 14 and can be used in the electrostatic bonding process.

Referring to FIGS. 4A–4G, a method for making electrostatic force bonding in accordance with another embodiment of the present invention is described below. In this method, a conductive layer 22 is deposited on a sub-component 16 as shown in FIG. 4A. A variety of different techniques for depositing, forming, or otherwise connecting the conductive layer 22 on or to sub-component 16 can be used including, but not limited to sputtering and chemical vapor deposition.

An insulating layer 12 is deposited on the conductive layer 22 as shown in FIG. 4B. A variety of different techniques for depositing, forming, or otherwise connecting the insulating layer 12 on or to the conductive layer 22 can be used, such as a chemical vapor deposition process.

Next, another insulating layer 14 is deposited on the insulating layer 12 to form a dual dielectric as shown in FIG. 4C. An interface 20 is located between the insulating layers 12 and 14 where "e−" trapped charge resides, although other types of trapped charge can be used, such as "+" if the trapped charge is holes. In this particular embodiment, the deposition of insulating layer 14 on insulating layer 12 has not resulted in trapped charge at and/or around the interface 20, although as described earlier the deposition of insulating layer 14 on insulating layer 12 could establish trapped charge depending on the process used. Again a variety of different techniques for depositing, forming, or otherwise connecting the insulating layer 14 on or to insulating layer 12 can be used, such as a chemical vapor deposition process.

Next, a conductive layer 26 is deposited on the insulating layer 14 as shown in FIG. 4D. A variety of different techniques for depositing, forming, or otherwise connecting the conductive layer 26 on or to insulating layer 14 can be used including, but not limited to sputtering and chemical vapor deposition.

Next, power source 27, such as a voltage source, is connected between and applies an electrical bias between the conductive layer 22 and the conductive layer 26 as shown in FIG. 4E. When a sufficient electrical bias is applied between the conductive layer 22 and the conductive layer []6 electrons can be forced to tunnel into the conduction band of insulating layer 14 to be trapped at the interface 20 creating the trapped charge. In this particular embodiment, an electrical bias of about $10^7$ volts/cm was applied to create an electric field sufficiently strong for the tunneling, although the amount of bias applied can vary as necessary. In order to control which electrode, i.e. the conductive layer 22 or the conductive layer 26, either injects electrons or extracts electrons (hole injection), the polarity of the bias must be defined, and the thickness of each insulating layer 12 and 14 must be controlled, as well as the material choice for the insulating layer 12 and 14, (i.e. the permittivity and band gap considerations). In this particular embodiment, the conductive layer 22 is connected to the positive terminal of power supply 27 and the conductive layer 26 is connected to the negative terminal of power supply 27, the insulating layer 12 is about 0.1 microns thick and is made of $Si_3N_4$, insulating layer 14 is about 0.03 microns thick and is made of $SiO_2$, although other parameters and materials could be used. This injection process by applying an electrical bias may be used when there is no trapped charge or to increase the amount of trapped charge at and around the interface 20 between insulating layers 12 and 14.

Next, the power source 27 is turned off or disconnected and the conductive layer 26 is removed from insulating layer 14 as shown in FIG. 4F. A variety of different techniques for removing the conductive layer 26 from insulating layer 14 can be used, such as an etching process. Trapped charge "e−" resides at the interface 20 between the insulating layers 12 and 14.

Next, an assembly 18 which has "+" induced charge is provided, although other types of induced charge can be used, such as "−" can be used if the trapped charge is "+". The insulating layer 14 with the trapped charge at the interface 20 and connected to the sub-component 16 is placed adjacent to or on the desired location on assembly 18. Electrostatic forces between the trapped charge and the induced charge bond the insulating layer 14 to the assembly 18 as shown in FIG. 4G. A bonding material may be applied on at least a portion of the insulating layer 14 and/or the assembly 18 to help to affix the sub-component 16 to the assembly 18.

Referring to FIGS. 5A–5E, a method for making electrostatic force bonding in accordance with another embodiment of the present invention is described below. The portion of the method described above and shown in FIG. 1A for depositing insulating layer 12 on sub-component 16 is identical to the portion of the method shown in FIG. 5A and thus will not be described again here.

Next, a floating conductive layer 24(1) is deposited on the insulating layer 12 as shown in FIG. 5B. A variety of different techniques for depositing, forming, or otherwise connecting the floating conductive layer 24(1) on or to insulating layer 12 can be used including, but not limited to sputtering or chemical vapor deposition. In this particular embodiment, insulating layers 12 and 14 could be made of the same material, although different materials could also be used for each.

Next, an insulating layer 14 is deposited on the floating conductive layer 24(1) as shown in FIG. 5C. A variety of different techniques for depositing, forming, or otherwise connecting the insulating layer 14 on or to floating conductive layer 24(1) can be used, such as a chemical vapor deposition process.

Next, charge is injected into the insulating layer 14 and becomes established in the floating conductive layer 24(1) between insulating layers 12 and 14 as shown in FIG. 5D. A variety of techniques for injecting charge can be used, such as accelerating electrons through a potential and then injecting them. This injection process may be used when there is no trapped charge or to increase the amount of trapped charge in the floating conductive layer 24(1). The floating conductive layer 24(1) stores charge similarly to a floating gate electronically programmable field effect transistor which is typically used in EEPROMs.

Next, an assembly 18 is provided which has "+" induced charge, although other types of induced charge can be used, such as "−" if the trapped charge is "+". The insulating layer 14 with the trapped charge at the floating conductive layer 24(1) and connected to the sub-component 16 is placed adjacent to or on the desired location on assembly 18. Electrostatic forces between the trapped charge and the induced charge bond the insulating layer 14 to the assembly 18 as shown in FIG. 5E. A bonding material may be applied on at least a portion of the insulating layer 14 and/or the assembly 18 to help to affix the sub-component 16 to the assembly 18.

Referring to FIGS. 6A–6G, a method for making electrostatic force bonding in accordance with another embodiment of the present invention is described below. The portion of the method described above and shown in FIGS. 5A, 5B, 5C, and 5E for depositing insulating layer 12 on sub-component 16, depositing floating conductive layer 24(1) on insulating layer 12, depositing insulating layer 14 floating conductive layer 24(1), and placing insulating layer 14 on or adjacent to assembly 18 for electrostatic bonding is identical to the portion of the method shown in FIGS. 6A, 6B, 6C, and 6G and thus will not be described again here.

Once the insulating layer 14 is deposited on floating conductive layer 24(1), a conductive layer 26 is deposited on the insulating layer 14 as shown in FIG. 6D. A variety of different techniques for depositing, forming, or otherwise connecting the conductive layer 26 on or to insulating layer 14 can be used including, but not limited to sputtering or chemical vapor deposition. In this particular embodiment, at least a portion of the sub-component 16 is made of a conductive material, although the sub-component 16 could be made of other types of materials.

Next, power source 27, such as a voltage source, is connected between and applies an electrical bias between the sub-component 16 and the conductive layer 26 as shown in FIG. 6E. When a sufficient electrical bias is applied between the sub-component 16 and the conductive layer 26, electrons can be forced to tunnel into the conduction band of the insulating layer 14 to be stored in floating conductive layer 24(1) creating the trapped charge. In this particular embodiment, an electrical bias of about $10^7$ volts/cm was applied to create an electric field sufficiently strong for the tunneling, although the amount of bias applied can vary as necessary. In order to control which electrode, i.e. the sub-component 16 or the conductive layer 26, either injects electrons or extracts electrons (hole injection), the polarity of the bias must be defined, and the thickness of each insulating layer 12 and 14 must be controlled, as well as the material choice for the insulating layer 12 and 14, (i.e. the permittivity and band gap considerations). In this particular embodiment, the sub-component 16 is connected to the positive terminal of power supply 27 and the conductive layer 26 is connected to the negative terminal of power supply 27, the insulating layer 12 is about 0.1 microns thick and is made of $Si_3N_4$, insulating layer 14 is about 0.03 microns thick and is made of $SiO_2$, although other parameters and materials could be used. For example, the insulating layers 12 and 14 in this embodiment could be the same material and thickness. The injection process by applying an electrical bias may be used when there is no trapped charge or to increase the amount of trapped charge stored in the floating conductive layer 24(1) between insulating layers 12 and 14.

Next, the power source 27 is turned off or disconnected and the conductive layer 26 is removed from insulating layer 14 as shown in FIG. 6F. A variety of different techniques for removing the conductive layer 26 from insulating layer 14 can be used, such as an etching process. Trapped charge "e−" is stored in the floating conductive layer 24(1) between the insulating layers 12 and 14 and can be used in the electrostatic bonding process. The floating conductive layer 24(1) stores charge similarly to a floating gate electronically programmable field effect transistor which is typically used in EEPROMs.

Referring to FIGS. 7A–7F, a method for making electrostatic force bonding in accordance with another embodiment of the present invention is described below. The portion of the method described above and shown in FIGS. 4A and 4B for depositing conductive layer 22 on sub-component 16 and depositing insulating layer 12 on conductive layer 22 is identical to the portion of the method shown in FIGS. 7A and 7B and thus will not be described again here.

Once the insulating layer 12 is deposited on the conductive layer 22, a conductive layer 24(2) is deposited on the insulating layer 12 as shown in FIG. 7C. A variety of different techniques for depositing, forming, or otherwise connecting the conductive layer 24(2) on or to insulating layer 12 can be used including, but not limited to sputtering or chemical vapor deposition.

Next, an insulating layer 14 is deposited on the conductive layer 24(2) as shown in FIG. 7D. A variety of different techniques for depositing, forming, or otherwise connecting the insulating layer 14 on or to conductive layer 24(2) can be used, such as a chemical vapor deposition process.

Next, charge is injected into the insulating layer 14 and becomes established in the conductive layer 24(2) between insulating layers 12 and 14 as shown in FIG. 7E. A variety of techniques for injecting charge can be used, such as accelerating electrons through a potential and then injecting them. This injection process may be used when there is no trapped charge or to increase the amount of trapped charge in the conductive layer 24(2).

Next, an assembly 18 is provided which has "+" induced charge, although other types of induced charge can be used, such as "−" if the trapped charge is "+". The insulating layer 14 with the trapped charge stored in the conductive layer 24(2) and connected to the sub-component 16 is placed adjacent to or on the desired location on assembly 18. Electrostatic forces between the trapped charge and the induced charge bond the insulating layer 14 to the assembly 18 as shown in FIG. 7F. A bonding material may be applied on at least a portion of the insulating layer 14 and/or the assembly 18 to affix the sub-component 16 to the assembly 18.

Referring to FIGS. 8A–8H, a method for making electrostatic force bonding in accordance with another embodiment of the present invention is described below. The portion of the method described above and shown in FIGS. 7A–7D and 7F for depositing conductive layer 22 on sub-component 16, depositing insulating layer 12 on conductive layer 22, depositing conductive layer 24(2) on insulating layer 12, depositing insulating layer 14 on conductive layer 24(2), and placing insulating layer 14 on or adjacent to assembly 18 for electrostatic bonding is identical to the portion of the method shown in FIGS. 8A–8D and 8H and thus will not be described again here.

Once the insulating layer 14 is deposited on the conductive layer 24(2), a conductive layer 26 is deposited on the insulating layer 14 as shown in FIG. 8E. A variety of different techniques for depositing, forming, or otherwise connecting the conductive layer 26 on or to insulating layer 14 can be used including, but not limited to sputtering or chemical vapor deposition.

Next, power source 27, such as a voltage source, is connected between and applies an electrical bias between the conductive layer 22 and the conductive layer 26 as shown in FIG. 8F. When a sufficient electrical bias is applied between the conductive layer 22 and the conductive layer 26, electrons can be forced to tunnel into the conduction band of insulating layer 14 to be stored in conductive layer 24(2) creating the trapped charge. In this particular embodiment, an electrical bias of about $10^7$ volts/cm was applied sufficient to cause an electric field, although the amount of bias applied can vary as necessary. In order to control which electrode, i.e. the conductive layer 22 or the conductive layer 26, either injects electrons or extracts electrons (hole injection), the polarity of the bias must be defined, and the thickness of each insulating layer 12 and 14 must be controlled, as well as the material choice for the insulating layer 12 and 14, (i.e. the permittivity and band gap considerations). In this particular embodiment, the conductive layer 22 is connected to the positive terminal of power supply 27 and the conductive layer 26 is connected to the negative terminal of power supply 27, the insulating layer 12 is about 0.1 microns thick and is made of $Si_3N_4$, insulating layer 14 is about 0.03 microns thick and is made of $SiO_2$, although other parameters and materials could be used. This injection process by applying an electrical bias may be used when there is no trapped charge or to increase the amount of trapped charge stored in the conductive layer 24(2) between insulating layers 12 and 14.

Next, the power source 27 is turned off or disconnected and the conductive layer 26 is removed from insulating layer 14 as shown in FIG. 8G. A variety of different techniques for removing the conductive layer 26 from insulating layer 14 can be used, such as a masking and etching process. Trapped charge "e−" is stored in the conductive layer 24(2) between the insulating layers 12 and 14 and can be used in the electrostatic bonding process.

Although in the embodiments described herein two insulating layers 12 and 14 are used, charge can be stored in a unit, such as sub-component 16 or assembly 18, in other configurations and manners, such as in interfaces and/or conducting layers between multiple insulating layers and/or in other regions of the unit.

Accordingly, the present invention provides an easy and effective method and system for temporarily or permanently bonding or holding a component or sub-component on an assembly by taking advantage of the extremely strong electrostatic attraction between fixed charge and reflected induced charge. The two units could also have opposite sign charge to create an even stronger attractive or bonding force.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefor, is not intended to limit the claimed processes to any order except as may be specified in the claims. Accordingly, the invention is limited only by the following claims and equivalents thereto.

What is claimed is:

1. A system for electrostatic force bonding, the system comprising:

a first unit having a first region with fixed, trapped charge; and a second unit with a first region with induced charge, electrostatic forces between the fixed, trapped charge in the first region of the first unit and the induced charge in the first region of the second unit bonding the first and second units together wherein the first region of the first unit comprises a first layer and a second layer on top of the first layer to form a dual dielectric, the dual dielectric having an interface between the first and second layers where at least a portion of the fixed, trapped charge resides.

2. The system as set forth in claim 1 wherein one of the first and second units is a component and the other one of the first and second units is an assembly.

3. The system as set forth in claim 1 further comprising a bonding material on at least a portion of at least one of the first region of the first unit and the first region of the second unit.

4. The system as set forth in claim 1 wherein the first and second layers comprise different materials.

5. The system as set forth in claim 1 wherein one of the first and second layers is silicon oxide and the other one of the first and second layers is silicon nitride.

6. The system as set forth in claim 1 wherein one of the first and second layers is silicon oxide and the other one of the first and second layers is aluminum oxide.

7. The system as set forth in claim 1 wherein the second layer is thinner than the first layer.

8. The system as set forth in claim 1 wherein the first region of the first unit further comprises a third layer in the first unit, the third layer is made of a conductive material and is located between at least a portion of the first layer and a remaining region of the first unit.

9. The system as set forth in claim 8 further comprising a fourth layer between the first and second layers, the fourth layer is made of a conductive material and acts as the interface between the first and second layers, wherein at least a portion of the trapped charge resides in the fourth layer.

10. The system as set forth in claim 1 further comprising a third layer between the first and second layers, the third layer is made of a conductive material and acts as the interface between the first and second layers, wherein at least a portion of the trapped charge resides in the third layer.

11. A system for electrostatic bonding, the system comprising:

a first substrate;

a first insulating layer on at least a portion of the substrate;

a second insulating layer on at least a portion of the first insulating layer to form a dual dielectric with fixed, trapped charge residing at an interface between the first and second insulating layers; and a second substrate bonded to the second insulating layer with electrostatic forces between the fixed, trapped charge and induced charge in the second substrate.

12. The system as set forth in claim 11 further comprising a bonding material on at least a portion of at least one of the second insulating layer and the second substrate.

13. The system as set forth in claim 11 wherein the first and second insulating layers comprise different materials.

14. The system as set forth in claim 11 wherein one of the first and second insulating layers is silicon oxide and the other one of the first and second layers is silicon nitride.

15. The system as set forth in claim 11 wherein one of the first and second insulating layers is silicon oxide and the other one of the first and second layers is aluminum oxide.

16. The system as set forth in claim 11 wherein the second insulating layer is thinner than the first insulating layer.

17. A system for electrostatic bonding, the system comprising:
- a first substrate;
- a first conductive layer on at least a portion of the substrate;
- a first insulating layer on at least a portion of the first conductive layer;
- a second insulating layer on at least a portion of the first insulating layer to form a dual dielectric, fixed, trapped charge residing at an interface between the first and second insulating layers; and
- a second substrate bonded to the second insulating layer with electrostatic forces between the trapped charge and induced charge in the second substrate.

18. The system as set forth in claim 17 further comprising a bonding material on at least a portion of at least one of the second insulating layer and the second substrate.

19. The system as set forth in claim 17 wherein the first and second insulating layers comprise different materials.

20. The system as set forth in claim 17 wherein one of the first and second insulating layers is silicon oxide and the other one of the first and second insulating layers is silicon nitride.

21. The system as set forth in claim 17 wherein one of the first and second insulating layers is silicon oxide and the other one of the first and second insulating layers is aluminum oxide.

22. The system as set forth in claim 17 wherein the second insulating layer is thinner than the first insulating layer.

23. A system for electrostatic bonding, the system comprising:
- a first substrate;
- a first insulating layer on at least a portion of the first substrate;
- a first conductive layer on at least a portion of the first insulating layer, the first conductive layer having fixed, trapped charge;
- a second insulating layer on at least a portion of the first conductive layer; and
- a second substrate bonded to the second insulating layer with electrostatic forces between the fixed, trapped charge and induced charge in the second substrate.

24. The system as set forth in claim 23 further comprising a bonding material on at least a portion of at least one of the second insulating layer and the second substrate.

25. The system as set forth in claim 23 wherein the first and second insulating layers comprise different materials.

26. The system as set forth in claim 23 wherein one of the first and second insulating layers is silicon oxide and the other one of the first and third layers is silicon nitride.

27. The system as set forth in claim 23 wherein one of the first and second insulating layers is silicon oxide and the other one of the first and third layers is aluminum oxide.

28. The system as set forth in claim 23 wherein the second insulating layer is thinner than the first insulating layer.

29. A system for electrostatic bonding, the system comprising:
- a first substrate;
- a first conductive layer on at least a portion of the first substrate;
- a first insulating layer on at least a portion of the first conductive layer;
- a second conductive layer on at least a portion of the first insulating layer, the second conductive layer having fixed, trapped charge;
- a second insulating layer on at least a portion of the second conductive layer;
- a second substrate bonded to the second insulating layer with electrostatic forces between the fixed, trapped charge and induced charge in the second substrate.

30. The system as set forth in claim 29 further comprising a bonding material on at least a portion of at least one of the second insulating layer and the second substrate.

31. The system as set forth in claim 29 wherein the first and second insulating layers comprise different materials.

32. The system as set forth in claim 29 wherein one of the first and second insulating layers is silicon oxide and the other one of the first and second layers is silicon nitride.

33. The system as set forth in claim 29 wherein one of the first and second insulating layers is silicon oxide and the other one of the first and second layers is aluminum oxide.

34. The system as set forth in claim 29 wherein the second insulating layer is thinner than the first insulating layer.

* * * * *